(12) United States Patent
Hekmatshoar-Tabari et al.

(10) Patent No.: US 9,064,924 B2
(45) Date of Patent: Jun. 23, 2015

(54) HETEROJUNCTION BIPOLAR TRANSISTORS WITH INTRINSIC INTERLAYERS

(71) Applicant: International Business Machines Corporation, Armonk, NY (US)

(72) Inventors: Bahman Hekmatshoar-Tabari, Mount Kisco, NY (US); Tak H. Ning, Yorktown Heights, NY (US); Devendra K. Sadana, Pleasantville, NY (US); Ghavam G. Shahidi, Round Ridge, NY (US); Davood Shahrjerdi, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/839,100

(22) Filed: Mar. 15, 2013

(65) Prior Publication Data

US 2013/0313551 A1 Nov. 28, 2013

Related U.S. Application Data

(60) Provisional application No. 61/651,125, filed on May 24, 2012.

(51) Int. Cl.
*H01L 29/66* (2006.01)
*H01L 29/737* (2006.01)
(Continued)

(52) U.S. Cl.
CPC ........ *H01L 29/737* (2013.01); *H01L 21/02592* (2013.01); *H01L 21/02447* (2013.01);
(Continued)

(58) Field of Classification Search
CPC ............ H01L 21/02636; H01L 29/1604; H01L 29/7375; H01L 29/06; H01L 29/73; H01L 29/737; H01L 29/0817; H01L 29/1004; H01L 29/7378; H01L 21/02592
USPC .............. 257/197–201; 438/162, 407, 482, 438/527–528
See application file for complete search history.

(56) References Cited

U.S. PATENT DOCUMENTS 5,196,907 A 3/1993 Birkle et al.
5,686,734 A * 11/1997 Hamakawa et al. ............ 257/16
(Continued)

FOREIGN PATENT DOCUMENTS

WO WO 2006040735 A1 4/2006
WO WO 2007088494 A1 8/2007
WO WO 2008017714 A1 2/2008

OTHER PUBLICATIONS

U.S. Appl. No. 13/481,048 Entitled, "Bipolar Junction Transistor With Epitaxial Contacts", filed May 25, 2012, First Named Inventor: Bahman Hekmatshoartabari.
(Continued)

*Primary Examiner* — Matthew W Such
*Assistant Examiner* — Stephen C Smith
(74) *Attorney, Agent, or Firm* — Scully, Scott, Murphy & Presser, P.C.; Louis J. Percello, Esq.

(57) ABSTRACT

Heterojunction bipolar transistors are provided that include at least one contact (e.g., collector, emitter, and/or base) formed by a heterojunction between a crystalline semiconductor material and a doped non-crystalline semiconductor material layer. An interfacial intrinsic non-crystalline semiconductor material layer is present at the heterojunction between the crystalline semiconductor material and the doped non-crystalline semiconductor material layer. The presence of the interfacial intrinsic non-crystalline semiconductor material layer improves the surface passivation of the crystalline semiconductor material by reducing the interface defect density at the heterojunction.

15 Claims, 6 Drawing Sheets

(51) Int. Cl.
*H01L 21/02* (2006.01)
*H01L 29/735* (2006.01)
*H01L 29/16* (2006.01)
*H01L 29/165* (2006.01)

(52) U.S. Cl.
CPC ...... *H01L21/0245* (2013.01); *H01L 21/02507* (2013.01); *H01L 21/02529* (2013.01); *H01L 21/02532* (2013.01); *H01L 21/0262* (2013.01); *H01L 29/66242* (2013.01); *H01L 29/735* (2013.01); *H01L 29/1604* (2013.01); *H01L 29/165* (2013.01)

(56) References Cited

U.S. PATENT DOCUMENTS

| | | | |
|---|---|---|---|
| 6,534,790 | B2 | 3/2003 | Kato et al. |
| 7,579,287 | B2 | 8/2009 | Ishihara et al. |
| 8,084,786 | B2 * | 12/2011 | John et al. .................... 257/197 |
| 8,779,597 | B2 * | 7/2014 | Lee .................... 257/773 |
| 2003/0207524 | A1 | 11/2003 | Zhang et al. |
| 2004/0256633 | A1 | 12/2004 | Thornton et al. |
| 2010/0314664 | A1 * | 12/2010 | John et al. .................... 257/197 |
| 2011/0003456 | A1 | 1/2011 | Mazzola |
| 2012/0049282 | A1 | 3/2012 | Chen et al. |
| 2012/0118383 | A1 | 5/2012 | Bedell et al. |
| 2012/0210932 | A1 | 8/2012 | Hekmatshoartabari et al. |
| 2012/0228611 | A1 | 9/2012 | Chan et al. |
| 2013/0313552 | A1 | 11/2013 | Hekmatshoar-Tabari et al. |

OTHER PUBLICATIONS

Sakamoto, Y., et al; "Perfluoropentacene: High-performance p-n junctions and complementary circuits with pentacene", Journal of the American Chemical Society, (Jul. 7, 2004), vol. 126, No. 26, pp. 8138-8140.

Klauk, H. et al., "Flexible organic complementary circuits", Electron Devices, IEEE Transactions on Electron Devices, (Apr. 2005), vol. 52, No. 4, pp. 68-622.

Hekmatshoar, B. et al., "Heterojunction bipolar transistors with hydrogenated amorphous silicon contacts on crystalline silicon", Electronic Letters, (Aug. 30, 2012), vol. 48, No. 18, pp. 1161-1163.

Notice of Allowance dated Oct. 15, 2014 received in U.S. Appl. No. 13/839,161.

U.S. Office Action dated Aug. 21, 2014 received in U.S. Appl. No. 13/838,695.

Gelatos, A.V. and Kanicki, J., "Investigation of the Silicon Nitride on Hydrogenated Amorphous Silicon Interface", Mat. Res. Soc. Symp. Proc., 1989, vol. 149., pp. 729-734.

Campmany, J.L., et al., "Plasma-deposited silicon nitride films with low hydrogen content for amorphous silicon thin-film transistors application", Sensors and Actuators A, 1993, v.77-38, pp. 333-336.

U.S. Office Action dated Jan. 23, 2015 received in U.S. Appl. No. 13/838,695.

Hekmatshoar, B., et al., "Novel heterojunction solar cells with conversion efficiencies approaching 21% on p-type crystalline silicon substrates", Electron Devices Meeting (IEDM), 2011 IEEE International, Date of Conference: Dec. 5-7, 2011, pp. 36.6.1-36.6.4.

Office Action dated Nov. 24, 2014 received in U.S. Appl. No. 13/839,213.

* cited by examiner

HETEROJUNCTION BIPOLAR TRANSISTORS WITH INTRINSIC INTERLAYERS

RELATED APPLICATION

The present application claims benefit of U.S. Provisional Application Ser. No. 61/651,125, filed on May 24, 2012, the entire content of which is incorporated herein by reference.

BACKGROUND

The present disclosure relates to semiconductor structures and methods of fabricating the same. More particularly, the present disclosure relates to heterojunction bipolar transistors and methods of fabricating the same.

The heterojunction bipolar transistor (HBT) is a type of bipolar junction transistor (BJT) which uses differing semiconductor materials for the emitter and base regions, thus creating a heterojunction. The HBT improves on the BJT in that the HBT can handle signals of very high frequencies, up to several hundred GHz. HBTs are commonly used in ultrafast circuits, mostly radio-frequency (RF) systems, and in applications requiring a high power efficiency, such as RF power amplifiers in cellular phones.

Heterojunction contacts are of interest in bipolar junction transistors particularly at the emitter junction for increasing the gain of the transistor. Conventionally, heterojunctions are formed by epitaxial growth techniques such as metal-organic chemical vapor deposition (MOCVD), which are expensive and/or require high temperatures, typically greater than 600° C. Depending on the application, the high growth temperature may have any or all of the following drawbacks: degradation of minority carrier lifetime, creation of structural defects, undesired impurity diffusion resulting in junction widening, relaxation of strain or generation of undesired strain which may result in buckling or delamination.

SUMMARY

Heterojunction bipolar transistors are provided that include at least one contact (e.g., collector, and/or emitter, and/or base) formed by a heterojunction between a crystalline semiconductor material and a doped non-crystalline semiconductor material layer. An interfacial intrinsic non-crystalline semiconductor material layer is present at the heterojunction between the crystalline semiconductor material and the doped non-crystalline semiconductor material layer. The presence of the interfacial intrinsic non-crystalline semiconductor material layer improves the surface passivation of the crystalline semiconductor material by reducing the interface defect density at the heterojunction.

In one aspect of the present disclosure, a heterojunction bipolar transistor is provided. In this aspect of the present disclosure, the heterojunction bipolar transistor includes a crystalline semiconductor material. The heterojunction bipolar transistor of the present disclosure also includes at least one contact that is in direct physical contact with a surface portion of the crystalline semiconductor material. The at least one contact of the present disclosure comprises an interfacial intrinsic non-crystalline semiconductor material in direct contact with the surface portion of the crystalline semiconductor material and a doped non-crystalline semiconductor material located on a surface of the interfacial intrinsic non-crystalline semiconductor material.

In one embodiment, the at least one contact is a collector contact, an emitter contact, or both. In such an embodiment, the crystalline semiconductor material in which the direct contact of the collector contact and/or emitter contact is made is of the first conductivity type and the doped non-crystalline semiconductor material is of a second conductivity type which is opposite from the first conductivity type.

In another embodiment, the at least one contact is a base contact. In such an embodiment, the crystalline semiconductor material in which the direct contact of the base contact is made is of a first conductivity type and the doped non-crystalline semiconductor material is also of the first conductivity type. In this case, the concentration of the first conductivity type dopant within the doped non-crystalline semiconductor material is greater than the concentration of first conductivity dopant within the crystalline semiconductor material in which direct contact of the base contact is made.

In another embodiment of the present disclosure, the at least one contact is a collector contact, an emitter contact, and a base contact. In this embodiment, the crystalline semiconductor material in which the direct contact of the collector contact and the emitter contact is made is of a first conductivity type and the doped non-crystalline semiconductor material of each of the collector contact and emitter contact is of a second conductivity type which is opposite from the first conductivity type. In the case of the base contact, the crystalline semiconductor material in which the direct contact of the base contact is made is of the first conductivity type and the doped non-crystalline semiconductor material of the base contact is also of the first conductivity type. In this case, the concentration of the first conductivity type dopant within the doped non-crystalline semiconductor material of the base contact is greater than the concentration of first conductivity dopant within the crystalline semiconductor material in which direct contact of the base contact is made.

In another embodiment, a heterojunction bipolar transistor is provided that includes a crystalline semiconductor material having two crystalline semiconductor regions of a first conductivity type which are spaced apart by an adjoining crystalline semiconductor region of a second conductivity type which is opposite from the first conductivity type. The structure further includes a collector contact in direct physical contact with a surface portion of one of crystalline semiconductor regions of the first conductivity type, wherein the collector contact comprises a first interfacial intrinsic non-crystalline semiconductor material in direct contact with the surface portion of one of the crystalline semiconductor regions of the first conductivity type and a first doped non-crystalline semiconductor material of the first conductivity type located on a surface of the first interfacial intrinsic non-crystalline semiconductor material. The structure also includes an emitter contact in direct physical contact with a surface portion of another of the crystalline semiconductor regions of the first conductivity type, wherein the emitter contact comprises a second interfacial intrinsic non-crystalline semiconductor material in direct contact with the surface portion of the another of the crystalline semiconductor region of the first conductivity type and a second doped non-crystalline semiconductor material of the first conductivity type located on a surface of the second interfacial intrinsic non-crystalline semiconductor material. The structure even further includes a base contact in direct physical contact with a surface portion of the adjoining crystalline semiconductor region of the second conductivity type, wherein the base contact comprises a third interfacial intrinsic non-crystalline semiconductor material in direct contact with the surface portion of the adjoining crystalline semiconductor region of the second conductivity type and a third doped non-crystalline semiconductor material of the second conductivity type located on a surface of the third interfacial intrinsic non-crystalline semiconductor material.

In another aspect of the present disclosure, methods of forming heterojunction bipolar transistors are provided. In one embodiment of the present disclosure, the method includes forming an interfacial intrinsic non-crystalline semiconductor material layer on a surface of a crystalline semiconductor material. Next, a doped non-crystalline semiconductor material layer is formed on an exposed surface of the interfacial intrinsic non-crystalline semiconductor material layer. After forming the doped non-crystalline semiconductor material layer, at least one electrode material portion is formed on an exposed surface of the doped non-crystalline semiconductor material layer.

In another embodiment of the present disclosure, the method includes forming a blanket layer of passivation material on a surface of a crystalline semiconductor material. Next, at least one opening is provided into the blanket layer of passivation material which exposes at least one portion of the surface of the crystalline semiconductor material. An interfacial intrinsic non-crystalline semiconductor material layer is then formed at least within the least one opening. Next, a doped non-crystalline semiconductor material layer is formed on an exposed surface of the interfacial intrinsic non-crystalline semiconductor material layer. After forming the doped non-crystalline semiconductor material layer, at least one electrode material portion is formed on an exposed surface of the doped non-crystalline semiconductor material layer that is located above the at least one opening.

DETAILED DESCRIPTION

The present disclosure, which relates to heterojunction bipolar transistors and methods of fabricating the same, will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The present disclosure provides heterojunction bipolar transistors including at least one contact (i.e., emitter contact, and/or base contact, and/or collector contact) formed by a heterojunction between a crystalline semiconductor material and a doped non-crystalline semiconductor material layer. In accordance with the present disclosure, the at least one contact also includes an interfacial intrinsic non-crystalline semiconductor material layer present between the crystalline semiconductor material and the doped non-crystalline semiconductor material layer. The presence of the interfacial intrinsic non-crystalline semiconductor material layer improves the surface passivation of the crystalline semiconductor material by reducing the interface defect density at the heterojunction. The term "heterojunction" denotes a p/n, p/n, p+/p, n+/n junction formed between the doped non-crystalline semiconductor material layer and the crystalline semiconductor material. The interfacial intrinsic non-crystalline semiconductor material layer is sufficiently thin to ensure low contact resistance at the heterojunction by allowing sufficient carrier transport between the doped non-crystalline semiconductor material layer and the crystalline semiconductor material by tunneling. Since the doping efficiency of the non-crystalline semiconductor materials (i.e., the interfacial intrinsic non-crystalline semiconductor material layer and the doped non-crystalline semiconductor material layer) is low, the doped non-crystalline semiconductor material layer is also sufficiently thin to ensure low contact resistance at the heterojunction.

The term "crystalline" is used throughout the present disclosure to denote a single crystalline material, a multi-crystalline material or a polycrystalline material. Typically, the crystalline semiconductor material that is employed in the present disclosure is comprised of a single crystalline semiconductor material. The term "non-crystalline" is used throughout the present disclosure to denote an amorphous, nano-crystalline or micro-crystalline material. Typically, the non-crystalline semiconductor material that is employed in the present disclosure is amorphous. The term "intrinsic" is used throughout the present disclosure to denote a semiconductor material that contains no doping atoms therein or alternatively a semiconductor material in which the concentration of dopant atoms therein is less than $10^{15}$ atoms/cm$^3$.

Referring first to FIGS. 1-4, there are illustrated basic processing steps that can be used in one embodiment of the present disclosure in forming a heterojunction bipolar transistor of the present disclosure. In this embodiment of the present disclosure, the heterojunction contact comprises a material stack of, from bottom to top, an interfacial intrinsic non-crystalline semiconductor material layer and a doped non-crystalline semiconductor material layer which is formed upon one surface of a crystalline semiconductor material.

Figure 1:
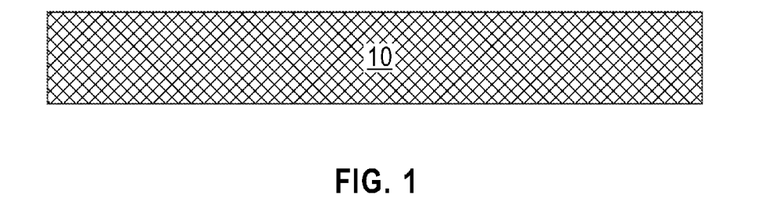
FIG. 1 is a pictorial representation (through a cross sectional view) illustrating a crystalline semiconductor material that can be employed in one embodiment of the present disclosure.

FIG. 1 illustrates a crystalline semiconductor material 10 that can be employed in one embodiment of the present disclosure. In some embodiments, and as illustrated, for example, in FIG. 1, the crystalline semiconductor material 10 is a bulk semiconductor substrate. In other embodiments of the present disclosure (not shown in FIG. 1, but illustrated in FIGS. 11E and 11F), the crystalline semiconductor material 10 can be an uppermost semiconductor layer of a semiconductor-on-insulator layer in which at least an insulating layer is located beneath the uppermost semiconductor layer, i.e., the crystalline semiconductor material 10. In some embodiments, a handle substrate (not shown in FIG. 1, but illustrated in FIGS. 11E and 11F) such as, for example, a semiconductor substrate, glass, plastic or metal foil can be located directly beneath the insulating layer. In embodiments where the handle substrate is insulating, a separate insulating layer is not needed since the insulating handle substrate can serve as the insulating material.

In one embodiment, the crystalline semiconductor material 10 that can be employed in the present disclosure can be an III-V compound semiconductor which includes at least one element from Group IIIA (i.e., Group 13) of the Periodic Table of Elements and at least one element from Group VA (i.e., Group 15) of the Periodic Table of Elements. The range of possible formulae for suitable III-V compound semiconductors that can be used in the present disclosure is quite broad because these elements can form binary (two elements, e.g., gallium (III) arsenide (GaAs)), ternary (three elements, e.g., indium gallium arsenide (InGaAs)) and quaternary (four elements, e.g., aluminum gallium indium phosphide (AlInGaP)) alloys.

In another embodiment of the present disclosure, the crystalline semiconductor material 10 can be a semiconductor material having the formula $Si_yGe_{1-y}$ wherein y is $0 \leq y \leq 1$. In some embodiments, in which y is 1, the crystalline semiconductor material 10 can be comprised entirely of Si. In another embodiment, in which y is 0, the crystalline semiconductor material 10 can be comprised entirely of Ge. In yet another embodiment and when y is other than 0 or 1, the crystalline semiconductor material 10 can be comprised entirely of a SiGe alloy.

In yet another embodiment of the present disclosure, the crystalline semiconductor material 10 can be a semiconductor material comprised of SiC.

In some embodiments of the present disclosure, the crystalline semiconductor material 10 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

In some embodiments, and as shown in FIG. 1, the entirety of the crystalline semiconductor material 10 is of a first conductivity type, i.e., either p-type or n-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the crystalline semiconductor material 10 of the present disclosure is p-type, the p-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present disclosure is p-type, the p-type dopant is present in a concentration ranging from $1 \times 10^{14}$ atoms/cm$^3$ to $1 \times 10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the crystalline semiconductor material 10 of the present disclosure is n-type, the n-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present disclosure is n-type, the n-type dopant is present in a concentration ranging from $1 \times 10^{14}$ atoms/cm$^3$ to $1 \times 10^{19}$.

In some embodiments (not shown in FIG. 1, but shown in FIG. 11F), the crystalline semiconductor material 10 contains at least one crystalline semiconductor region of a first conductivity type and an adjoining crystalline semiconductor region of a second conductivity type that is opposite from the first conductivity type. This particular embodiment will be described in greater detail in conjunction with the discussion of FIG. 11F.

The dopant concentration of the first conductivity type and/or, if present, the second conductivity type within the crystalline semiconductor material 10 of the present disclosure may be graded or uniform. By "uniform" it is meant that the dopant concentration of first conductivity type and/or, if present, the second conductivity type is the same throughout the entire thickness of the crystalline semiconductor material 10. For example, a crystalline semiconductor material 10 having a uniform dopant concentration of the first conductivity type and/or, if present, the second conductivity type may have the same dopant concentration at the upper surface and bottom surface of the semiconductor material, as well as the same dopant concentration at a central portion of the semiconductor material between the upper surface and the bottom surface of the crystalline semiconductor material 10. By "graded" it is meant that the dopant concentration of the first conductivity type and/or, if present, the second conductivity type varies throughout the thickness of the crystalline semiconductor material 10. For example, a crystalline semiconductor material 10 having a graded dopant concentration may have an upper surface with a greater dopant concentration of the first conductivity type and/or, if present, the second conductivity type than the bottom surface of the crystalline semiconductor material 10, and vice versa.

In some embodiments, the first or second conductivity type can be introduced during the growth of the crystalline semiconductor material that can be used as element 10 of the present disclosure. Alternatively, the conductivity type can be introduced into an intrinsic crystalline semiconductor material by utilizing ion implantation, and/or gas phase doping and the doped crystalline semiconductor material can be employed as the crystalline semiconductor material 10. When various semiconductor regions of different conductivity type are present within the crystalline semiconductor material 10, a predetermined semiconductor region or regions of the crystalline semiconductor material can be selectively doped to an opposite conductivity type by using ion implantation and/or gas phase doping. The doping of the preselected semiconductor region or regions can occur before or during the processing of the present disclosure.

The thickness of the crystalline semiconductor material 10 can be from 3 nm to 3 µm. Other thicknesses that are lesser than, or greater than, the aforementioned thickness range can also be employed for the thickness of the crystalline semiconductor material 10.

Figure 2:
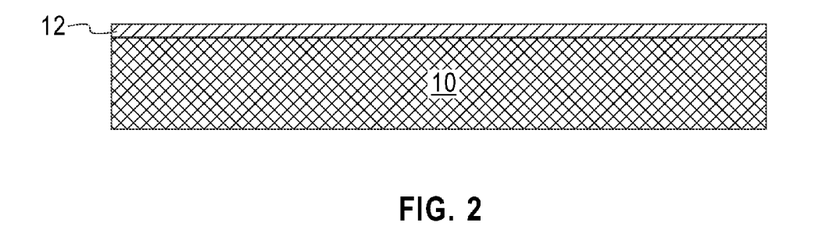
FIG. 2 is a pictorial representation (through a cross sectional view) illustrating the crystalline semiconductor material of FIG. 1 after forming an interfacial intrinsic non-crystalline semiconductor material layer on a surface thereof in accordance with an embodiment of the present disclosure.

Referring now to FIG. 2, there is illustrated the crystalline semiconductor material 10 of FIG. 1 after forming an interfacial intrinsic non-crystalline semiconductor material layer 12 on a surface of the crystalline semiconductor material 10. In this embodiment of the present disclosure, the interfacial intrinsic non-crystalline semiconductor material layer 12 is contiguous and thus spans the entirety of the crystalline semiconductor material 10.

In one embodiment of the present disclosure, the interfacial intrinsic non-crystalline semiconductor material layer 12 may be hydrogenated. The term "hydrogenated" denotes that the semiconductor material layer includes hydrogen therein. In one embodiment in which the interfacial intrinsic non-crystalline semiconductor material layer 12 is an intrinsic hydrogenated non-crystalline semiconductor material, the intrinsic hydrogenated non-crystalline semiconductor material may contain from 5 atomic % to 40 atomic % hydrogen therein. In another embodiment in which the interfacial intrinsic non-crystalline semiconductor material layer 12 is an intrinsic hydrogenated non-crystalline semiconductor material, the intrinsic hydrogenated non-crystalline semiconductor material may contain from 10 atomic % to 25 atomic % hydrogen therein. In yet another embodiment in which the interfacial intrinsic non-crystalline semiconductor material layer 12 is an intrinsic hydrogenated non-crystalline semiconductor material, the intrinsic hydrogenated non-crystalline semiconductor material may contain from 20 atomic % to 30 atomic % hydrogen therein.

The interfacial intrinsic non-crystalline semiconductor material layer 12 may comprise a same or different semiconductor material as that of the crystalline semiconductor material 10. In one embodiment, the interfacial intrinsic non-crystalline semiconductor material layer 12 has a formula $Si_xGe_{1-x}$ wherein x is $0 \leq x \leq 1$. As such, the interfacial intrinsic non-crystalline semiconductor material layer 12 may comprise Si (when x is 1), Ge (when x is 0), or a SiGe (when x is other than 1, or 0).

In some embodiments of the present disclosure, the interfacial intrinsic non-crystalline semiconductor material layer 12 can contain C therein. When present, C can be present in a concentration from 0 atomic % to 50 atomic %. In some embodiments, the interfacial intrinsic non-crystalline semiconductor material layer 12 can contain from 0 atomic % to 25 atomic % carbon therein. The carbon impurity can be added by way of either a source gas that includes carbon, or by introducing a carbon source gas into the gas mixture that is employed in the present disclosure for forming the interfacial intrinsic non-crystalline semiconductor material layer 12.

In some embodiments of the present disclosure, the interfacial intrinsic non-crystalline semiconductor material layer 12 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

In one embodiment, the interfacial intrinsic non-crystalline semiconductor material layer 12 can be formed by plasma enhanced chemical vapor deposition (PECVD). PECVD is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration. In other embodiments, a hot-wire chemical vapor deposition (HWCVD) process can be used in forming the interfacial intrinsic non-crystalline semiconductor material layer 12. In yet another embodiment, sputtering can be used in forming the interfacial intrinsic non-crystalline semiconductor material layer 12.

The interfacial intrinsic non-crystalline semiconductor material layer 12 can be formed at a temperature close to 200° C., with highest quality films typically grown at temperatures in the range of 150° C.-250° C., however temperatures in the range from room-temperature (i.e., 20° C.) up to 450° C. may be used.

In one embodiment, the source gas used to form the interfacial intrinsic non-crystalline semiconductor material layer 12 may comprise a Si-containing precursor, such as, for example, a silane and a disilane and/or a germanium-containing precursor such as, for example, a germane, $GeH_4$. In some embodiments, Si-containing and Ge-containing precursors can be used in forming the doped hydrogenated semiconductor material layer. Other gases including a carbon source such, as for example, $CH_4$ may be used.

In some embodiments, ammonia ($NH_3$), nitrous oxide ($N_2O$) or other gas sources may be used for nitrogen containing semiconductor material layers. Carbon dioxide ($CO_2$), $N_2O$ or $O_2$ may be used to provide oxygen for oxygen containing semiconductor material layers. A carrier gas such as hydrogen ($H_2$), deuterium ($D_2$) helium (He) or argon (Ar) may be used for any or all of the layers. The carrier gas may be pre-mixed with the gas sources or flowed simultaneously with the gas source at the time of growth.

The interfacial intrinsic non-crystalline semiconductor material layer 12 serves to passivate the surface of the crystalline semiconductor material 10. The interfacial intrinsic non-crystalline semiconductor material layer 12 is sufficiently thin to ensure low contact resistance at the junction by allowing sufficient carrier transport between the doped non-crystalline semiconductor material layer (to be subsequently formed) and the crystalline semiconductor material 10 by tunneling. Since the doping efficiency of non-crystalline, particularly, amorphous semiconductor materials is low, the doped non-crystalline semiconductor material layers are also sufficiently thin to ensure low contact resistance at the heterojunction. The thickness of the interfacial intrinsic non-crystalline semiconductor material layer 12 is typically in the range from 3 nm to 10 nm, although a thinner or thicker interfacial intrinsic non-crystalline semiconductor material layer 12 can also be employed.

In one embodiment, the interfacial intrinsic non-crystalline semiconductor material layer 12 may be a single layer. In another embodiment, the interfacial intrinsic non-crystalline semiconductor material layer 12 may be a multilayered structure containing a same semiconductor material or different semiconductor materials. Also, the composition of the interfacial intrinsic non-crystalline semiconductor material layer(s) 12 may be constant or vary across the interlayer.

Figure 3:
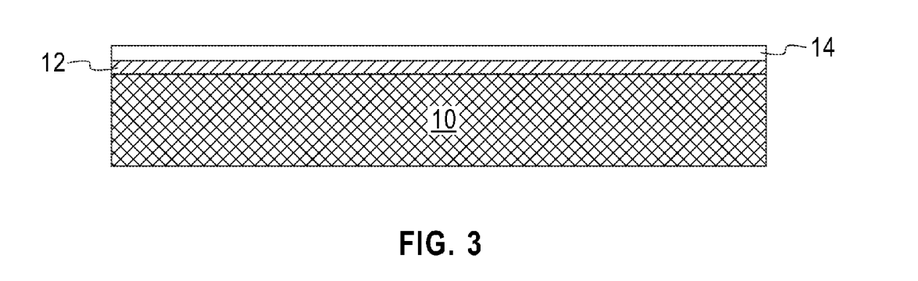
FIG. 3 is a pictorial representation (through a cross sectional view) illustrating the structure of FIG. 2 after forming a doped non-crystalline semiconductor material layer on an exposed surface of the interfacial intrinsic non-crystalline semiconductor material layer in accordance with an embodiment of the present disclosure.

Referring now to FIG. 3, there is illustrated the structure of FIG. 2 after forming a doped non-crystalline semiconductor material layer 14 on an exposed surface of the interfacial intrinsic non-crystalline semiconductor material layer 12 in accordance with an embodiment of the present disclosure.

In one embodiment of the present disclosure, the doped non-crystalline semiconductor material layer 14 may be hydrogenated. In one embodiment in which the doped non-crystalline semiconductor material layer 14 is a doped hydrogenated non-crystalline semiconductor material, the doped hydrogenated non-crystalline semiconductor material may contain from 5 atomic % to 40 atomic % hydrogen therein. In another embodiment in which the doped non-crystalline semiconductor material layer 14 is a doped hydrogenated non-crystalline semiconductor material, the doped hydrogenated non-crystalline semiconductor material may contain from 10 atomic % to 25 atomic % hydrogen therein. In yet another embodiment in which the doped non-crystalline semiconductor material layer 14 is a doped hydrogenated non-crystalline semiconductor material, the doped hydrogenated non-crystalline semiconductor material may contain from 20 atomic % to 30 atomic % hydrogen therein.

The doped non-crystalline semiconductor material layer 14 may comprise a same or different semiconductor material as that of the crystalline semiconductor material 10. Also, the doped non-crystalline semiconductor material layer 14 may comprise a same or different semiconductor as the interfacial intrinsic non-crystalline semiconductor material layer 12. In one embodiment, the doped non-crystalline semiconductor material layer 14 has a formula $Si_qGe_{1-q}$ wherein q is $0 \leq q \leq 1$. As such, the doped non-crystalline semiconductor material layer 14 may comprise Si (when q is 1), Ge (when q is 0), or a SiGe (when q is other than 1, or 0).

In some embodiments of the present disclosure, the doped non-crystalline semiconductor material layer 14 can contain C therein. When present, C can be present in a concentration from 0 atomic % to 50 atomic %. In some embodiments, the doped non-crystalline semiconductor material layer 14 can contain from 0 atomic % to 25 atomic % carbon therein. The carbon impurity can be added by way of either a source gas that includes carbon, or by introducing a carbon source gas into the gas mixture that is employed in the present disclosure for forming the doped non-crystalline semiconductor material layer 14.

In some embodiments of the present disclosure, the doped non-crystalline semiconductor material layer 14 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

The dopant that is contained within the doped non-crystalline semiconductor material layer 14 can be a p-type dopant or an n-type dopant. In some embodiments, the heterojunction bipolar transistor includes a collector contact and/or an emitter contact in which each doped non-crystalline semiconductor material layer 14 of such contacts has a conductivity type that is opposite to the conductivity type of the crystalline semiconductor material 10. In such a structure and in the case of a base contact, the doped non-crystalline semiconductor material layer 14 of such a contact has a conductivity type that is the same as the conductivity type of the crystalline semiconductor material 10. In the case of the base contact, however, the concentration of the dopant within the doped non-crystalline semiconductor material layer 14 of the base contact is greater than the concentration, of the same dopant type, in the crystalline semiconductor material 10. The dopant within the doped non-crystalline semiconductor material layer 14 can be uniformly present or present as a gradient.

In some embodiments (see, for example, FIG. 11F), the heterojunction bipolar transistor includes a collector contact and/or an emitter contact in which each doped non-crystalline semiconductor material layer 14 of such contacts has a conductivity type that is the same type as one of the crystalline semiconductor regions within the crystalline semiconductor material 10. In such a structure and in the case of the collector and/or emitter contact, the concentration of the dopant within the doped non-crystalline semiconductor material layer 14 of the collector and/or emitter may be greater than the concentration, of the same dopant type, in the crystalline semiconductor material 10. In such a structure and in the case of a base contact, the doped non-crystalline semiconductor material layer 14 of such a contact has a conductivity type that is the same as the conductivity type of another crystalline semiconductor region of the crystalline semiconductor material 10. In the case of the base contact, however, the concentration of the dopant within the doped non-crystalline semiconductor material layer 14 of the base contact is greater than the concentration, of the same dopant type, in the crystalline semiconductor material 10.

In a Si-containing doped non-crystalline semiconductor material layer 14 examples of p-type dopants, i.e., impurities, include but are not limited to, boron, aluminum, gallium and indium. In one embodiment, in which the doped non-crystalline semiconductor material layer 14 includes a p-type dopant, the p-type dopant is present in a concentration ranging from $10^{16}$ atoms/cm$^3$ to $10^{21}$ atoms/cm$^3$. In another embodiment, in which the doped non-crystalline semiconductor material layer 14 contains p-type dopant, the p-type dopant is present in a concentration ranging from $10^{18}$ atoms/cm$^3$ to $5\times10^{20}$ atoms/cm$^3$. In a Si-containing doped non-crystalline semiconductor material layer 14, examples of n-type dopants, i.e., impurities, include but are not limited to, antimony, arsenic and phosphorous. In one embodiment, in which the doped non-crystalline semiconductor material layer 14 contains an n-type dopant, the n-type dopant is present in a concentration ranging from $10^{16}$ atoms/cm$^3$ to $10^{21}$ atoms/cm$^3$. In another embodiment, in which doped non-crystalline semiconductor material layer 14 contains an n-type dopant, the n-type dopant is present in a concentration ranging from $10^{18}$ atoms/cm$^3$ to $5\times10^{20}$ atoms/cm$^3$.

In one embodiment, the doped non-crystalline semiconductor material layer 14 can be formed by plasma enhanced chemical vapor deposition (PECVD). In other embodiments, a hot-wire chemical vapor deposition (HWCVD) process can be used in forming the doped non-crystalline semiconductor material layer 14. In yet another embodiment, sputtering can be used in forming the doped non-crystalline semiconductor material layer 14. The non-crystalline semiconductor material can be formed utilizing conditions, source gases and other gases that are the same as that mentioned above for the interfacial intrinsic non-crystalline semiconductor material layer 12. The dopant within the doped non-crystalline semiconductor material layer 14 can be introduced during the formation of the non-crystalline semiconductor material utilizing one or more dopant gases. Alternatively, another intrinsic non-crystalline semiconductor material layer can be formed and then doped utilizing ion implantation and/or gas phase doping forming the doped non-crystalline semiconductor material layer 14.

In some embodiments of the present disclosure, the interfacial intrinsic non-crystalline semiconductor material layer 12 and the doped non-crystalline semiconductor material layer 14 can be formed within the same deposition tool without breaking vacuum between depositions. In other embodiments, the interfacial intrinsic non-crystalline semiconductor material layer 12 and the doped non-crystalline semiconductor material layer 14 can be formed in different processing tools and, as such, a vacuum is not maintained between the two deposition steps.

When a dopant gas is employed in forming the doped non-crystalline semiconductor material layer 14, the dopant gas that can be present during the deposition process provides the conductivity type, either n-type or p-type, to the doped non-crystalline semiconductor material layer 14. When a doped non-crystalline semiconductor material layer 14 of an n-type conductivity is to be formed, the dopant gas includes at least one n-type dopant, e.g., phosphorus or arsenic. For example, when phosphorus is the n-type dopant, the dopant gas can be phosphine (PH$_3$), and when arsenic is the n-type dopant, the dopant gas can be arsine (AsH$_3$). In one example, when the conductivity type dopant is n-type, the dopant gas include phosphine gas (PH$_3$) present in a ratio to silane (SiH$_4$) ranging from 0.01% to 10%. In another example, when the conductivity type dopant is n-type, the dopant gas include phosphine gas (PH$_3$) present in a ratio to silane (SiH$_4$) ranging from 0.1% to 2%.

When a doped non-crystalline semiconductor material layer 14 of a p-type conductivity is to be formed, a dopant gas including at least one p-type dopant, e.g., B, is employed. For example, when boron is the p-type dopant, the dopant gas can be diborane (B$_2$H$_6$). In one embodiment, wherein the conductivity type dopant is p-type, the dopant gas may be diborane (B$_2$H$_6$) present in a ratio to silane (SiH$_4$) ranging from 0.01% to 10%. In another embodiment, wherein the conductivity type dopant is p-type, the dopant gas may be diborane (B$_2$H$_6$) present in a ratio to silane (SiH$_4$) ranging from 0.1% to 2%. In yet another embodiment, in which the conductivity type dopant is p-type, the dopant gas for may be trimethylboron (TMB) present in a ratio to silane (SiH$_4$) ranging from 0.1% to 10%.

The thickness of the doped non-crystalline semiconductor material layer 14 is typically from 5 nm to 25 nm, although thinner or thicker layers may be used as well. In some embodiments and since the doped non-crystalline semiconductor material layer 14 and interfacial intrinsic non-crystalline semiconductor material layer 12 are thin and have low conductivities, the lateral conductivity between two (or more) adjacent electrode material portions through the doped/intrinsic non-crystalline semiconductor material layers is sufficiently low, and therefore effectively the two (or more) adjacent electrode material portions are electrically isolated.

In some embodiments (not shown in FIG. 4, but shown in FIG. 12A), at least one other doped non-crystalline semiconductor material layer (in FIG. 12A, the other doped non-crystalline semiconductor material layer is designated as element 50) can be formed atop the doped non-crystalline semiconductor material layer 14. In this embodiment, the other doped non-crystalline semiconductor material layer, which can be non-hydrogenated or hydrogenated, is of the same conductivity type as the doped non-crystalline semiconductor material layer 14 and is comprised of a lower band gap semiconductor material as that of the doped non-crystalline semiconductor material layer 14. In such an embodiment, the at least one other doped non-crystalline semiconductor material layer includes a different semiconductor material as that described above for the doped non-crystalline semiconductor material layer 14. For example, and when the doped non-crystalline semiconductor material layer 14 comprises silicon, the at least one other doped non-crystalline semiconductor material layer can comprise germanium. The dopant concentration and, if present, hydrogen concentration, in the at least one other doped non-crystalline semiconductor material layer are within the ranges mentioned above for the doped non-crystalline semiconductor material layer 14. The dopant within the at least one other doped non-crystalline semiconductor material layer can be uniformly present or present as a gradient. The at least one other doped non-crystalline semiconductor material layer can be formed utilizing one of the deposition techniques mentioned above in forming the doped non-crystalline semiconductor material layer 14.

In some embodiments (not shown in FIG. 4, but shown in FIG. 12B), the doped non-crystalline semiconductor material layer 14 is a multilayered stack comprising alternating layers of wide band gap and narrow band gap semiconductor materials. The terms "wide" and "narrow" are relative to each other. For example, the doped non-crystalline semiconductor material layer 14 may comprise a first doped non-crystalline semiconductor material having a wide band gap such as Si, a second doped non-crystalline semiconductor material having a narrow band gap such as, for example, Ge and a third doped non-crystalline semiconductor material having a wide band gap such as, for example, Si. A multilayered doped non-crystalline semiconductor material layer stack can be formed utilizing one of the deposition techniques mentioned above in forming the doped non-crystalline semiconductor material layer 14.

In some embodiments, the doped non-crystalline semiconductor material layer 14 which is in direct contact with the interfacial intrinsic non-crystalline semiconductor material layer 12 has a band gap larger than that of the crystalline semiconductor material 10. In such embodiments, if the stack of non-crystalline semiconductor material layers 12 and 14 is used for an emitter contact, the injection of carriers from base into the emitter is suppressed due the larger band gap of the doped non-crystalline semiconductor material layer 14, and therefore the gain of the heterojunction bipolar transistor is enhanced.

In one embodiment, the crystalline semiconductor material 10 is comprised of Si or SiGe with less than 50 atomic % Ge, and the interfacial intrinsic non-crystalline semiconductor material layer 12 is comprised of a-Si:H. In another embodiment, the crystalline semiconductor material 10 is comprised of Ge, or SiGe with higher than 50 atomic % Ge, and the interfacial intrinsic non-crystalline semiconductor material layer 12 is comprised of hydrogenated micro-crystalline Si (μc-Si:H). In another embodiment, the crystalline semiconductor material 10 is comprised of GaAs, and interfacial intrinsic non-crystalline semiconductor material layer 12 is comprised of a-Si:H.

In some embodiments and as mentioned above, a multilayer stack of doped non-crystalline semiconductor materials is used. In such an embodiment, the multilayered stack of doped non-crystalline semiconductor materials includes a first doped non-crystalline semiconductor material layer (i.e., layer 14 described above) and a second doped non-crystalline semiconductor material layer. In one example, the second doped non-crystalline semiconductor material layer may have a band gap lower than that of the first doped non-crystalline semiconductor material layer. The second doped non-crystalline semiconductor material layer of the multilayered stack which has a lower band gap typically has a higher doping activation than the first doped non-crystalline semiconductor material layer, i.e., layer 14, and in case it is used at the emitter, it provides a better carrier injection into the base, while the first doped non-crystalline semiconductor material layer of the multilayered stack suppresses the injection of carriers of the opposite type from the base into the emitter, thus improving the gain of the transistor.

In some embodiments, and when a multilayered stack of doped non-crystalline semiconductor material layers is employed, the doping of the one of doped layers can be enhanced by modulation doping (e.g., transfer doping), i.e., transfer of carriers of the corresponding conductivity type from the material with a larger band gap into the material with the lower band gap, or the transfer of the opposite type of carriers from the material with the lower band gap into the material with a higher band gap. In some embodiments and already mentioned above, the doped non-crystalline semiconductor material layer 14 can be comprised of a supperlattice, i.e., a multilayered structure comprised of alternating materials with low and high band gaps (with respect to each other).

Figure 4:
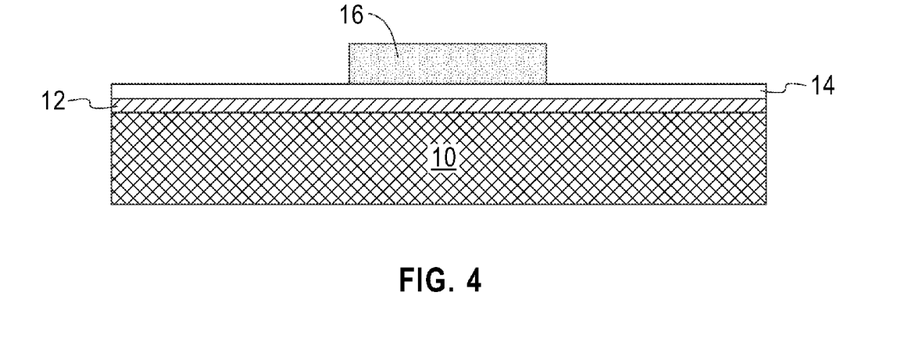
FIG. 4 is a pictorial representation (through a cross sectional view) illustrating the structure of FIG. 3 after forming at least one electrode material portion on an exposed surface of the doped non-crystalline semiconductor material layer in accordance with an embodiment of the present disclosure.

Referring now to FIG. 4, there is illustrated the structure of FIG. 3 after forming at least one electrode material portion 16 on an exposed surface of the doped non-crystalline semiconductor material layer 14 in accordance with an embodiment of the present disclosure. The electrode material portion 16 can be comprised of a conductive material including, for example, a doped Si-containing material, a conductive metal, a conductive metal alloy comprising at least two conductive metals, a conductive metal nitride, a transparent conductive oxide and/or a conductive metal silicide. Examples of conductive metals that can be used include, for example, Cu, W, Pt, Al, Pd, Ru, Ni, and Ir. The electrode material portion 16 can have a thickness from 1 nm to 1000 nm. Other thicknesses that are lesser than, or greater than, the aforementioned thickness range can also be employed as the thickness for the electrode material portion 16.

In some embodiments, the electrode material portion 16 can be formed using a deposition process including, for example, chemical vapor deposition, plasma enhanced chemical vapor deposition, sputtering, chemical solution deposition, or plating. Metal silicides can be formed utilizing any conventional silicidation process that is well known to those skilled in the art. In some embodiments, the conductive material can be patterned by lithography and etching as described hereinabove.

In cases in which a contact is needed on the other side of the crystalline semiconductor material 10, the crystalline semiconductor material 10 can be flipped 180° and the exposed bare surface of the crystalline semiconductor material 10 can be processed to include a contact of the present disclosure (i.e., the interfacial intrinsic non-crystalline semiconductor material layer(s), and the doped non-crystalline semiconductor material layer(s)). An electrode material portion can then be formed on an exposed uppermost surface of the doped non-crystalline semiconductor material layer(s). The contact can span the entire length of the bare surface of the crystalline semiconductor material and the above processing can be used in forming the contact. Alternatively, a blanket passivation material layer (as described herein below in conjunction with FIG. 5) can be formed on the bare surface of the crystalline semiconductor material 10, and then patterned (as described herein below in conjunction with FIG. 6) to include at least one opening therein. Thereafter, a contact in accordance with the present disclosure can be formed as described above or as described herein below in conjunction with FIGS. 7 and 8.

Figure 5:
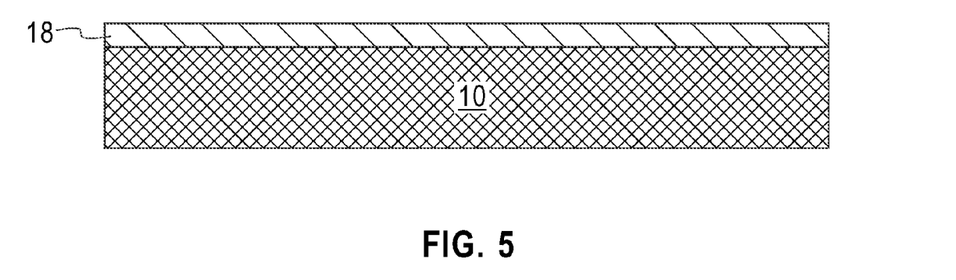
FIG. 5 is a pictorial representation (through a cross sectional view) illustrating the crystalline semiconductor material of FIG. 1 after forming a blanket layer of a passivation material on an exposed surface thereof in accordance with an embodiment of the present disclosure.

Referring now to FIG. 5, there is illustrated the crystalline semiconductor material 10 of FIG. 1 after forming a blanket layer of a passivation material 18 on an exposed surface thereof in accordance with an embodiment of the present disclosure. The passivation material serves to saturate dangling bonds on the surface of the crystalline semiconductor material 10, in order to reduce the recombination of carriers at the surface of the crystalline semiconductor material 10. The passivation material may also reduce the recombination of carriers at the surface of the crystalline semiconductor material 10 by "field-induced" passivation, for example by repelling the minority carriers from the surface of the crystalline semiconductor material 10. Field-induced passivation may be facilitated by the presence of fixed electronic charges in the passivation layer, formation of dipoles at the passivation/substrate interface, or the electric field induced by the workfunction difference between the passivation layer and the substrate semiconductor material. The passivation material may also serve to prevent air or moisture from being introduced into the crystalline semiconductor material 10. The passivation material that can be employed in the present disclosure includes, for example, a hard mask material such as, for example, a semiconductor oxide, a semiconductor nitride, a semiconductor oxynitride, or a multilayered stack thereof. The passivation material may also be comprised of a high-k dielectric (k>silicon oxide) such as aluminum oxide or hafnium oxide. In some embodiments, which is more typical to III-V materials, the passivation material may be comprised of a substantially undoped semiconductor material having a larger band gap than that of the crystalline semiconductor material 10 to passivate the surface of the crystalline semiconductor material 10 by repelling the minority carriers induced by workfunction difference between the semiconductor materials formed by the passivation material and the crystalline semiconductor material 10. In other embodiments, the passivation material can be comprised of silicon oxide, silicon nitride, and/or silicon oxynitride. The blanket layer of passivation material 18 can have a thickness from 5 nm to 50 nm. Other thicknesses that are below or above the aforementioned thickness range can also be employed.

In one embodiment, the blanket layer of passivation material 18 can be formed by a deposition process including, for example, chemical vapor deposition, plasma enhanced chemical vapor deposition, atomic layer deposition or chemical solution. In other embodiments, the blanket layer of passivation material 18 can be formed utilizing a thermal technique such as, for example, oxidation and/or nitridation. In yet other embodiments, a combination of a deposition process and a thermal technique can be used to form the blanket layer of passivation material 18. In still another embodiment, which is more typical to III-V materials, a substantially undoped semiconductor material having a larger band gap than that of the crystalline semiconductor material 10 can be used as the blanket layer of passivation material 18 and such a material can be grown on the crystalline semiconductor material 10 by conventional growth techniques such as, for example, molecular beam epitaxy or metal-organic chemical vapor deposition. The blanket layer of passivation material 18 that is formed at this stage of the present disclosure is a contiguous layer.

Figure 6:
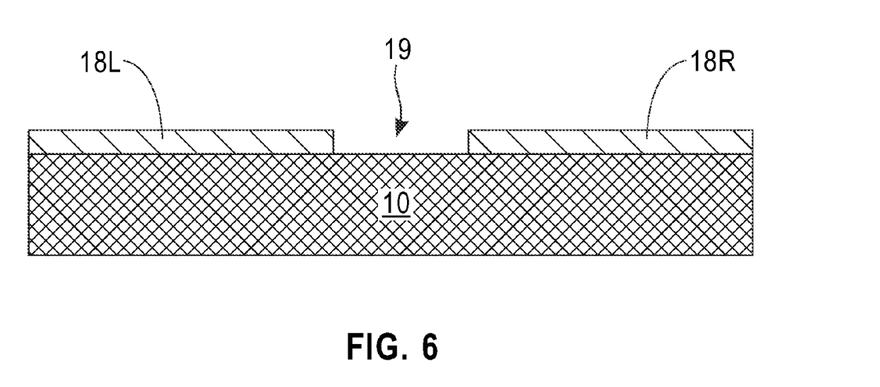
FIG. 6 is a pictorial representation (through a cross sectional view) illustrating the structure of FIG. 5 after forming at least one opening within the blanket layer of a passivation material, wherein each opening exposes a surface portion of the crystalline semiconductor material in accordance with an embodiment of the present disclosure.

Referring now to FIG. 6, there is illustrated the structure of FIG. 5 after forming at least one opening 19 within the blanket layer of a passivation material 18, wherein each opening 19 is a contact opening that exposes a surface portion of the crystalline semiconductor material 10. The remaining portions of the blanket layer of passivation material 18 can now be referred herein as passivation material layer portions 18L, 18R. In some embodiments, the width of each opening 19 that is formed is in the range of 10 nm to 100 nm. In other embodiments, the width of each opening 19 that is formed is in the range of 50 nm to 1 µm. In yet other embodiments, the width of each opening 19 that is formed is in the range of 500 nm to 100 µm. Contact openings narrower than 10 nm or wider than 100 µm can also be employed.

The at least one opening 19 that is formed into the blanket layer of passivation material 18 can be formed by lithography and etching. Lithography includes forming a photoresist material (not shown) on an exposed surface of the blanket layer of passivation material 18, exposing the photoresist material to a desired pattern of radiation and developing the photoresist material utilizing a conventional resist developer. The etching step, which transfers the pattern from the patterned photoresist into the blanket layer of passivation material 18, can include dry etching (i.e., reactive ion etching, ion beam etching, or plasma etching), wet chemical etching, or a combination thereof. Typically, a reactive ion etch is used to transfer the pattern from the patterned photoresist into the blanket layer of passivation material. After pattern transfer, the patterned photoresist is typically removed from the structure utilizing a conventional stripping process such as, for example, ashing.

Figure 7:
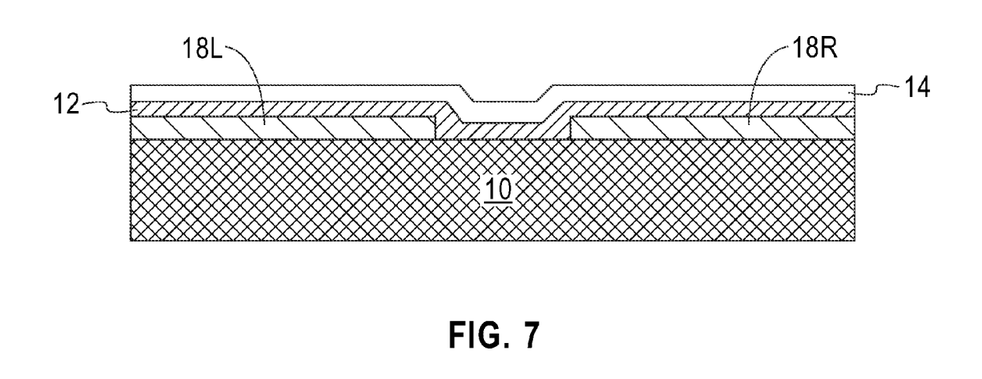
FIG. 7 is a pictorial representation (through a cross sectional view) illustrating the structure of FIG. 6 after forming a semiconductor material stack of, from bottom to top, an interfacial intrinsic non-crystalline semiconductor material layer and a doped non-crystalline semiconductor material layer thereon in accordance with an embodiment of the present disclosure.

Referring now to FIG. 7, there is illustrated the structure of FIG. 6 after forming a semiconductor material stack of, from bottom to top, an interfacial intrinsic non-crystalline semiconductor material layer 12 and a doped non-crystalline semiconductor material layer 14. The interfacial intrinsic non-crystalline semiconductor material layer 12 and the doped non-crystalline semiconductor material layer 14 and their formation within this embodiment of the present disclosure, are the same as that described above for the interfacial intrinsic non-crystalline semiconductor material layer 12 and the doped non-crystalline semiconductor material layer 14 described in the above embodiment depicted within FIGS. 1-4 of the present disclosure. As such, the above description concerning the interfacial intrinsic non-crystalline semiconductor material layer 12 and the doped non-crystalline semiconductor material layer 14 are incorporated herein for this embodiment of the present disclosure.

Figure 8:
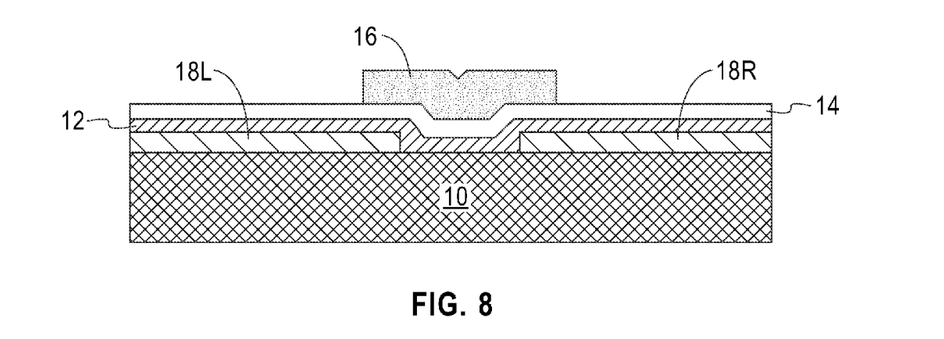
FIG. 8 is a pictorial representation (through a cross sectional view) illustrating the structure of FIG. 7 after forming at least one electrode material portion on an exposed surface of the doped non-crystalline semiconductor material layer and above each at least one opening that is formed in the blanket layer of passivation material in accordance with an embodiment of the present disclosure.

Referring to FIG. 8, there is illustrated the structure of FIG. 7 after forming at least one electrode material portion 16 on an exposed surface of the doped non-crystalline semiconductor material 14 and above each at least one opening 19 that is present between passivation material layer portions 18L, 18R. The at least one electrode material portion 16 and its formation within this embodiment of the present disclosure, are the same as that described above for at least one electrode material portion 16 described in the above embodiment depicted within FIGS. 1-4 of the present disclosure. As such, the above description concerning at least one electrode material portion 16 is incorporated herein for this embodiment of the present disclosure.

In cases in which a contact is needed on the other side of the crystalline semiconductor material 10, the crystalline semiconductor material 10 can be flipped 180° and the exposed bare surface of the crystalline semiconductor material 10 can be processed to include a contact of the present disclosure (i.e., the interfacial intrinsic non-crystalline semiconductor material layer(s), and the doped non-crystalline semiconductor material layer(s)) and an electrode material portion can be formed on an exposed uppermost surface of the doped non-crystalline semiconductor material layer(s). The contact can span the entire length of the bare surface of the crystalline semiconductor material and the above processing can be used in forming the contact. Alternatively, a blanket passivation material layer (as described herein above in conjunction with FIG. 5) can be formed on the bare surface of the crystalline semiconductor material 10, and then patterned (as described herein above in conjunction with FIG. 6) to include at least one opening therein. Thereafter, a contact in accordance with the present disclosure can be formed as described above or as described herein above in conjunction with FIGS. 7 and 8.

Figure 9:
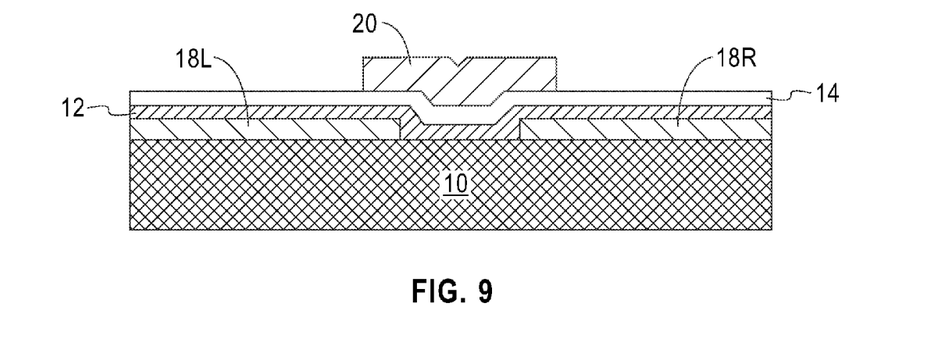
FIG. 9 is a pictorial representation (through a cross sectional view) illustrating the structure of FIG. 6 after forming at least one mask on an exposed surface of the doped non-crystalline semiconductor material layer and above each at least one opening that is formed in the blanket layer of passivation material in accordance with an embodiment of the present disclosure.

Referring now to FIG. 9, there is illustrated the structure of FIG. 6 after forming at least one mask 20 on an exposed surface of the doped non-crystalline semiconductor material 14 and above each at least one opening 19 that is present between the remaining passivation material layer portions 18L, 18R in accordance with an embodiment of the present disclosure.

In one embodiment, the at least one mask 20 that can be used may include a hard mask material that is the same or different from that of the passivation material. In another embodiment, the at least one mask 20 may be composed of one of the conductive materials mentioned above for the electrode material portion 16. The usage of a conductive material as mask 20 is advantageous since the same material can be used as the electrode of the heterojunction bipolar transistor of the present disclosure. The at least one mask 20 can be formed by providing a blanket layer of mask material (i.e., hard mask material or conductive material) utilizing one of the techniques mentioned above for either forming the blanket layer of passivation material 18, or forming the conductive material that forms the electrode material portion 16. After forming the blanket layer of mask material, the blanket layer of mask material is patterned by lithography and etching to provide the structure shown in FIG. 9. The etch is selective in removing exposed portions of the mask material not protected by remaining portions of the photoresist.

Figure 10:
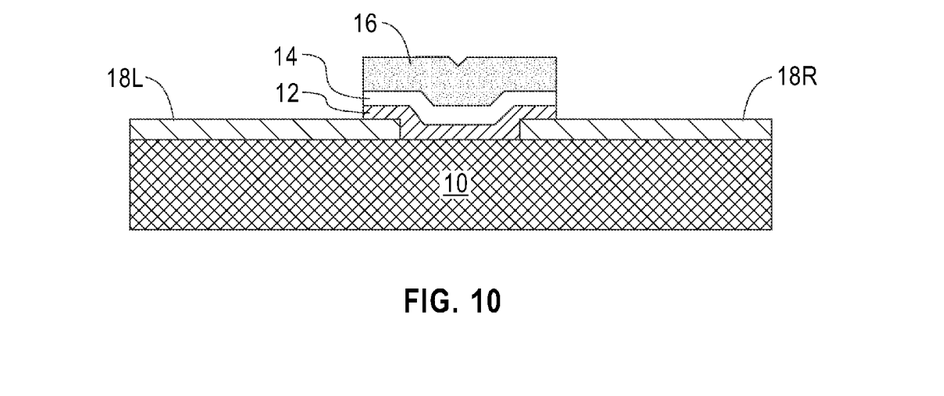
FIG. 10 is a pictorial representation (through a cross sectional view) illustrating the structure of FIG. 9 after etching exposed portions of the semiconductor material stack not protected by the at least one mask, and optionally replacing each mask with an electrode material portion in accordance with an embodiment of the present disclosure.

Referring now to FIG. 10, there is illustrated the structure of FIG. 9 after etching exposed portions of the semiconductor material stack not protected by the at least one mask 20, and optionally replacing each mask 20 with an electrode material portion 16 in accordance with an embodiment of the present disclosure. When the at least one mask 20 is a conductive material, the step of replacing each mask 20 with an electrode material portion 16 can be omitted since the conductive mask can serve as the electrode material portion 16. As shown, the etch removes portions of the doped non-crystalline semiconductor material layer(s) and portions of the interfacial intrinsic non-crystalline semiconductor material layer(s) which are not protected by mask 20 stopping on an upper surface of the passivation metal layer portions 18L, 18R.

In one embodiment, a single etch may be used to remove exposed portions of both the doped non-crystalline semiconductor material layer(s) and portions of the interfacial intrinsic non-crystalline semiconductor material layer(s) which are not protected by mask 20. In another embodiment, two separate etching steps can be used to remove the doped non-crystalline semiconductor material layer(s) and portions of the interfacial intrinsic non-crystalline semiconductor material layer(s) which are not protected by mask 20.

The etch or etches that can be used in this embodiment of the present disclosure may include for example, a dry etch process such as, for example, reactive ion etching, plasma etching or ion beam etching. Alternatively, a chemical wet etch can be employed. In one embodiment, the exposed portions of the doped non-crystalline semiconductor material layer(s) and portions of the interfacial intrinsic non-crystalline semiconductor material layer(s) which are not protected by mask 20 can be removed by $SF_6$, $SF_6/O_2$ or $CCl_2F_2/O_2$ plasma.

If the at least one mask 20 is other than a conductive material, the at least one mask 20 can be removed by conventional techniques, such as planarization and/or grinding, and an electrode material layer portion 16 can be formed as described above. In embodiments in which mask 20 is a conductive material, the mask 20 serves as one of the electrodes of the bipolar junction transistor of this embodiment of the present disclosure.

In cases in which a contact is needed on the other side of the crystalline semiconductor material 10, the crystalline semiconductor material 10 can be flipped 180° and the exposed bare surface of the crystalline semiconductor material 10 can be processed to include a contact of the present disclosure (i.e., the interfacial intrinsic non-crystalline semiconductor material layer(s), and the doped non-crystalline semiconductor material layer(s)) and an electrode material portion can be formed on an exposed uppermost surface of the doped non-crystalline semiconductor material layer(s). The contact can span the entire length of the bare surface of the crystalline semiconductor material and the above processing can be used in forming the contact. Alternatively, a blanket passivation material layer (as described herein above in conjunction with FIG. 5) can be formed on the bare surface of the crystalline semiconductor material 10, and then patterned (as described herein above in conjunction with FIG. 6) to include at least one opening therein. Thereafter, a contact in accordance with the present disclosure can be formed as described above or as described herein above in conjunction with FIGS. 7 and 8.

Reference is now made to FIGS. 11A, 11B, 11C, 11D, 11E and 11F, which illustrate some additional exemplary heterojunction bipolar transistors of the present disclosure. Each exemplary heterojunction bipolar transistor includes a contact of the present disclosure, i.e., a semiconductor material stack including an interfacial intrinsic non-crystalline semiconductor material layer(s) 12 and a doped non-crystalline semiconductor material layer(s) 14. The interfacial intrinsic non-crystalline semiconductor material layer 12 separates the crystalline semiconductor material 10 from the doped non-crystalline semiconductor material layer 14. The collector contact and the emitter contact comprise a doped non-crystalline semiconductor material of a conductivity type which differs from that of the crystalline semiconductor material in which direct contact of the collector contact and emitter contact are made. The base contact comprises a doped non-crystalline semiconductor material of a conductivity type which is the same as that of the crystalline semiconductor material in which direct contact of the contact of the base contact is made. In this case, the concentration of the dopant within the doped non-crystalline semiconductor layer is greater than that of the semiconductor region of the crystalline semiconductor material in which direct contact is made with the base contact.

Figure 11A:
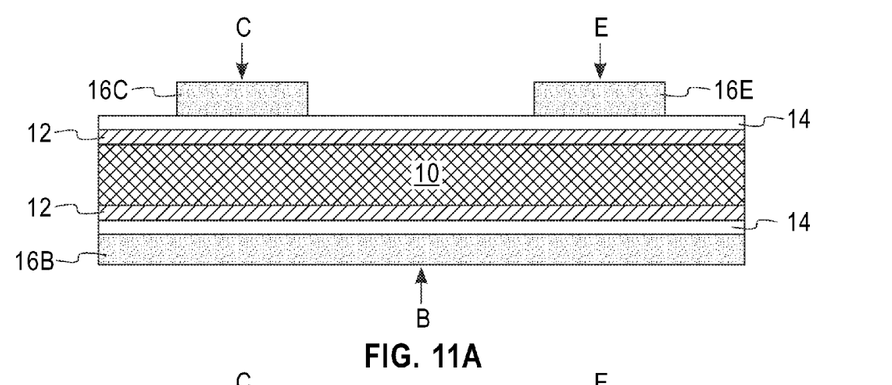
FIGS. 11A, 11B, 11C, 11D, 11E and 11F are pictorial representations (through cross sectional views) illustrating some additional exemplary heterojunction bipolar transistors of the present disclosure.
Figure 11B:
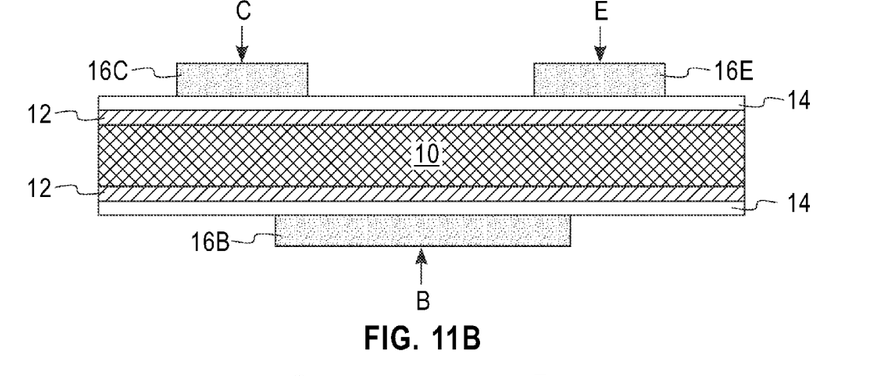

Specifically, FIGS. 11A and 11B illustrate exemplary heterojunction bipolar transistors wherein the collector, C, and the emitter, E electrodes are located on one side of a crystalline semiconductor material 10 of a first conductivity type, and the base, B, electrode is located on another side of the crystalline semiconductor material 10 which is opposite the side including the emitter, E, and collector, C, electrodes. The collector, C, electrode and the emitter, E electrode, each include an electrode material portion 16C, and 16E, respectively, and a contact which includes a semiconductor material stack of the interfacial intrinsic non-crystalline semiconductor material layer 12 and the doped non-crystalline semiconductor material layer 14 of a second conductivity which differs from the first conductivity type of the crystalline semiconductor material 12. The base, B, electrodes include an electrode material portion 16B, and a contact which includes a semiconductor material stack of the interfacial intrinsic non-crystalline semiconductor material layer 12 and the doped non-crystalline semiconductor material layer 14 of a first conductivity type which is the same as that of the semiconductor region of the crystalline semiconductor material 10 in which the direct contact of the contact of the base electrode is made. In this case, the concentration of the first conductivity type dopant within the doped non-crystalline semiconductor layer 14 of the base contact is greater than that of the semiconductor region of the crystalline semiconductor material 10 in which direct contact is made with the base contact. In the embodiments shown in FIGS. 11A and 11B, each contact including the semiconductor material stack of the interfacial intrinsic non-crystalline semiconductor material layer 12 and the doped non-crystalline semiconductor material layer 14 spans the entirety of the crystalline semiconductor material 10. Also, the electrode material portions 16C and 16E of the collector, C, and emitter, E, electrodes in FIGS. 11A and 11B are patterned and are not in direct physical contact with each other; they however share a common contact. The electrode material portion 16B of the base, B, electrode can be a contiguous electrode material portion, as shown in FIG. 11A, or it can be a patterned electrode material portion as shown, for example, in FIG. 11B. The exemplary heterojunction bipolar transistors shown in FIGS. 11A and 11B can be made using the basic processing steps mentioned above in conjunction with FIGS. 1-4.

Figure 11C:
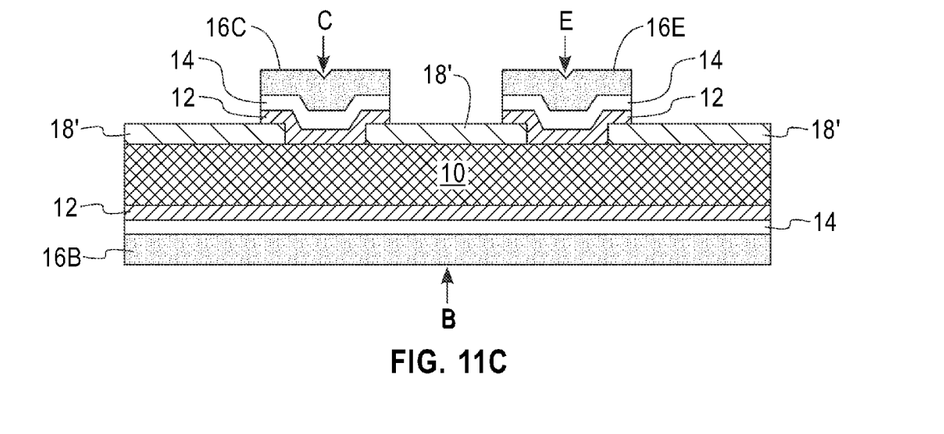
Figure 11D:
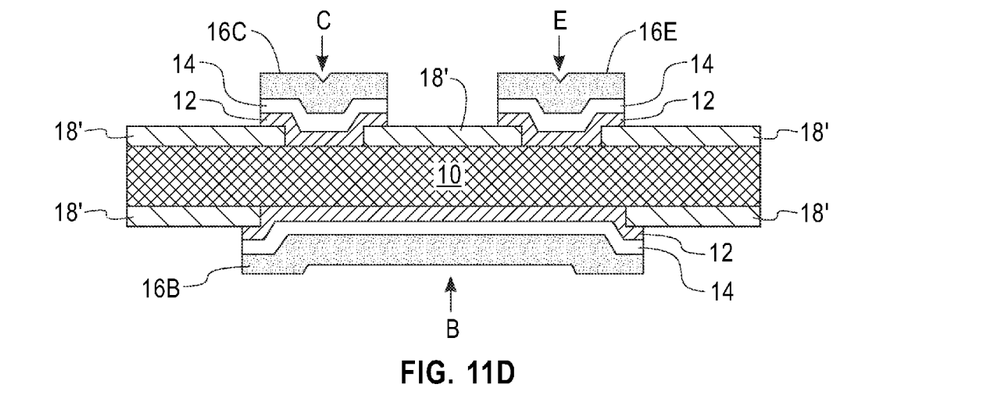

FIGS. 11C and 11D illustrate exemplary heterojunction bipolar transistors wherein the collector, C, and the emitter, E electrodes are located on one side of a crystalline semiconductor material 10 of a first conductivity type, and the base, B, electrode is located on another side of the crystalline semiconductor material 10 which is opposite the side including the emitter, E, and collector, C, electrodes. The collector, C, electrode and the emitter, E, electrode each include an electrode material portion 16C, and 16E, respectively, and a contact which includes a semiconductor material stack of the interfacial intrinsic non-crystalline semiconductor material layer 12 and the doped non-crystalline semiconductor material layer 14 of a second conductivity which differs from the first conductivity type of the crystalline semiconductor material 10. The base, B, electrodes include an electrode material portion 16B, and a contact which includes a semiconductor material stack of the interfacial intrinsic non-crystalline semiconductor material layer 12 and the doped non-crystalline semiconductor material layer 14 of a first conductivity type which is the same as that of the semiconductor region of the crystalline semiconductor material 10 in which the direct contact of the contact of the base electrode is made. In this case, the concentration of the first conductivity type dopant within the doped non-crystalline semiconductor layer of the base contact is greater than that of the semiconductor region of the crystalline semiconductor material 10 in which direct contact is made with the base contact.

In the embodiments illustrated in FIGS. 11C and 11D, the collector and emitter contacts including the semiconductor material stack of the interfacial intrinsic non-crystalline semiconductor material layer 12 and the doped non-crystalline semiconductor material layer 14 are patterned (i.e., non-contiguous material stack). Each patterned material stack which comprises the collector contact and the emitter contact is present above an opening that is located between two adjacent passivation material layer portions (in these drawings the passivation material layer portions are referred to as 18'; and 18' is equivalent to 18L, 18R mentioned above in conjunction with FIGS. 5-8 of the present disclosure). Also, the electrode material portions 16C and 16E of the collector, C, and emitter, E, electrodes in FIGS. 11C and 11D are patterned and are not in direct physical contact with each other; they however share a common contact. Further, the electrode material portions 16C and 16E of the collector, C, and emitter, E, electrodes in FIGS. 11C and 11D have outermost edges that are vertical coincident to outermost vertical edges of the semiconductor material stack which comprises the contact of the respective electrode. The electrode material portion 16B of the base, B, electrode can be a contiguous electrode material portion, as shown in FIG. 11C, or it can be a patterned electrode material portion as shown, for example, in FIG. 11D. The exemplary heterojunction bipolar transistors shown in FIGS. 11C and 11D can be made using the basic processing steps mentioned above in conjunction with FIGS. 1-8.

Figure 11E:
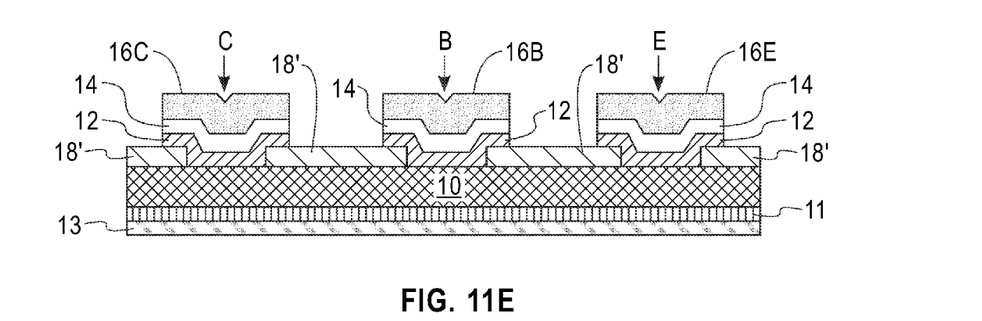
Figure 11F:
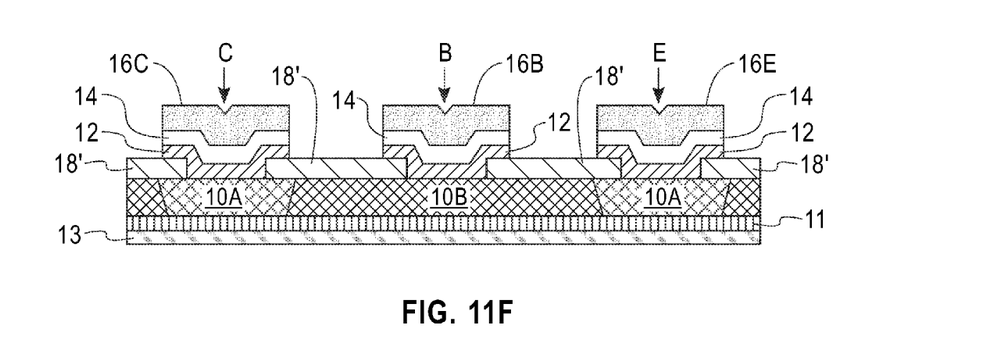

FIGS. 11E and 11F illustrate exemplary heterojunction bipolar transistors in which the collector, C, the emitter, E, and the base, B, electrodes are located on a same side of a crystalline semiconductor material 10. In one embodiment and as shown in FIG. 11E, the other side of the crystalline semiconductor material 10 has a surface that is in contact with a first surface of a buried insulating layer 11, and a handle substrate 13 is in contact with a second surface of the buried insulating layer 11. In such an embodiment, the entirety of the crystalline semiconductor material 10 is of a first conductivity type. In the structure shown in FIG. 11E, the doped non-crystalline semiconductor material layer 14 of the collector contact and the emitter contact, are each of a second conductivity which is opposite from the first conductivity of the crystalline semiconductor material 10. The doped non-crystalline semiconductor material layer 14 of the base contact is of the first conductivity, but the concentration of the first conductivity type dopant within the doped non-crystalline material layer 14 of the base contact is greater than that of the first conductivity type dopant in the crystalline semiconductor material 10.

In another embodiment, and as shown in FIG. 11F, the other side of the crystalline semiconductor material is in direct contact with a first surface of a buried insulating layer 11, and a second surface of the buried insulating layer, opposite to the first surface, is direct contact with surface of a handle substrate 13. In this embodiment, the crystalline semiconductor material 10 includes two crystalline semiconductor regions 10A of a first conductivity type which are separated from each other by an adjoining crystalline semiconductor region 10B of a second conductivity type that is opposite from the first conductivity type. In the structure shown in FIG. 11F, the semiconductor regions of the first conductivity type could be formed into a crystalline semiconductor material of a second conductivity type using the openings in the passivation material layer portions 18 by conventional techniques such as implantation and/or diffusion to define the base width, prior to the deposition of the contacts for the collector, base and the emitter electrodes. In the structure shown in FIG. 11F, the diffusion length of minority carriers (electrons in the p$^+$ region and holes in the n$^+$ regions) is typically larger (and preferably much larger) than the dimensions of the p$^+$ or n$^+$ doped regions formed by implantation and/or diffusion (Note the third dimension perpendicular to the plan of the drawing is not relevant). In the structure shown in FIG. 11F, the doped non-crystalline semiconductor material layer 14 of the collector contact and the emitter contact are each of a first conductivity type which is the same as the first conductivity type of the semiconductor regions 10A. In this structure, the concentration of the first conductivity type dopant within the doped non-crystalline material layer 14 of the collector contact and the emitter contact are preferably (but not necessarily) greater than that of the first conductivity type dopant in the crystalline semiconductor region 10A. The doped non-crystalline semiconductor material layer 14 of the base contact is of the second conductivity type, but the concentration of the second conductivity type dopant within the doped non-crystalline material layer 14 of the base contact is greater than that of the second conductivity type dopant in the crystalline semiconductor region 10B.

In either embodiment shown in FIGS. 11E and 11F, the collector, C, the emitter, E, and base, B, electrodes each include a patterned electrode material portion 16C, 16E, and 16B, respectively, and a patterned contact, each of which includes a patterned semiconductor material stack of the interfacial intrinsic non-crystalline semiconductor material layer 12 and the doped non-crystalline semiconductor material layer 14. The various collector, C, the emitter, E, and base, B, electrodes and their respective contacts are disjoined from each other and are separated by passivation material layer portions 18'.

Although the emitter, base and collector contacts described for FIGS. 11A-11F are all formed according to the present disclosure; the same bipolar junction transistor devices can be formed in which only one, or two, of the emitter, base and collector contacts are formed according to the present disclosure. In such embodiments, the contacts that do not include the material stack of the present disclosure, i.e., interfacial intrinsic non-crystalline semiconductor material layer and doped non-crystalline semiconductor material layer, can comprise conventional contacts that are well known to those skilled in the art.

Figure 12A:
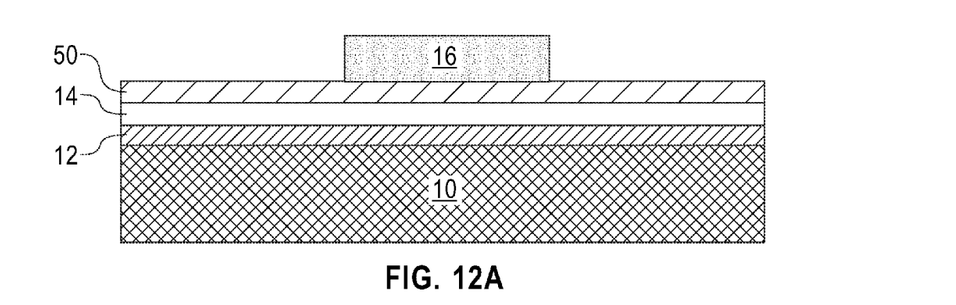
FIGS. 12A and 12B are pictorial representations (through cross sectional views) illustrating some yet further exemplary heterojunction bipolar transistors of the present disclosure.
Figure 12B:
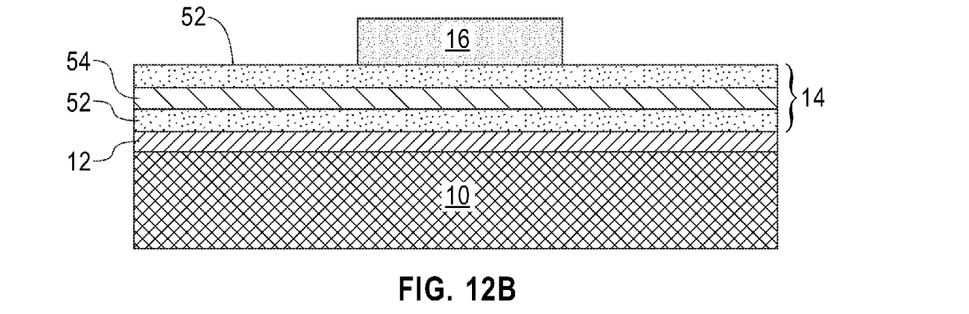

Reference is now made to FIGS. 12A and 12B, which are pictorial representations (through cross sectional view) illustrating some yet further exemplary heterojunction bipolar transistors of the present disclosure. The structure shown in FIG. 12A is essential equivalent to the structure shown in FIG. 5 of the present disclosure, except that the structure shown in FIG. 12A includes another doped non-crystalline semiconductor material layer 50 atop the doped non-crystalline semiconductor material layer 14. The another doped non-crystalline semiconductor material layer 50, which can be hydrogenated or non-hydrogenated, is comprised of a lower band gap semiconductor material as that of the doped non-crystalline semiconductor material layer 14. The dopant type of the another doped non-crystalline semiconductor material layer 50 is the same as that of the doped non-crystalline semiconductor material layer 14; however the dopant concentration of another doped non-crystalline semiconductor material layer 50 can be the same or different from the dopant concentration within the doped non-crystalline semiconductor material layer 14.

The structure shown in FIG. 12B is essential equivalent to the structure shown in FIG. 5 of the present disclosure, except that the structure shown in FIG. 12B includes a multilayered stack of doped non-crystalline semiconductor material layers comprising alternating layers of wide band gap and narrow band gap semiconductor materials. The terms "wide" and "narrow" are relative to each other. In the drawing, element 52 denotes a wide band gap semiconductor material such as, for example, Si, while element 54 denotes a narrow band gap semiconductor material such as, for example, Ge. The dopant within the multilayered doped non-crystalline semiconductor material stack is of a conductivity opposite that of the crystalline semiconductor material in which contact is made; however, however the dopant concentration within an individual layer of the multilayered stack of doped non-crystalline semiconductor materials can be the same or different from each layer within multilayered stack.

Figure 13A:
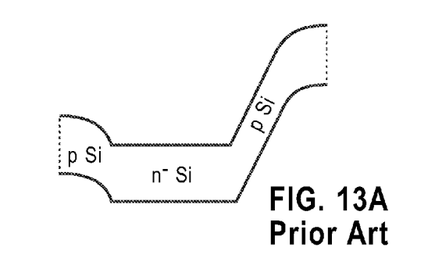
FIGS. 13A, 13B, 13C and 13D are schematic energy band gap diagrams showing the emitter and collector junctions for various bipolar transistors including a conventional homojunction bipolar transistor (not of the present disclosure; and shown in FIG. 13A) and exemplary heterojunction bipolar transistors of the present disclosure (shown in FIGS. 13B, 13C and 13D).
Figure 13B:
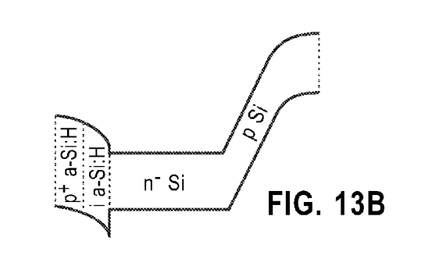
Figure 13C:
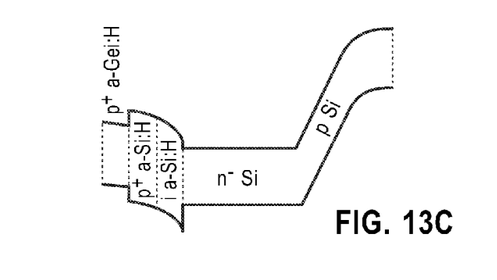
Figure 13D:
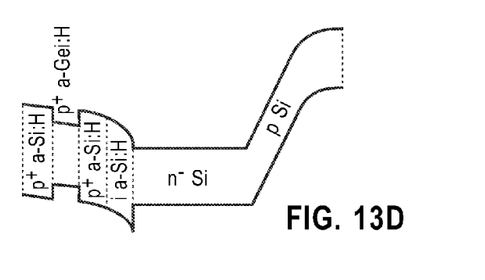

Referring now to FIGS. 13A, 13B, 13C and 13D, there are shown schematic energy band gap diagrams showing the emitter (left) and collector (right) junctions for various bipolar transistors including a conventional homojunction bipolar transistor (not of the present disclosure; and shown in FIG. 13A) and exemplary heterojunction bipolar transistors of the present disclosure (shown in FIGS. 13B, 13C and 13D). Specifically, FIG. 13A shows the schematic energy band diagram (emitter [left] and collector [right] junctions) of a conventional homojunction bipolar junction transistor comprised of an n-type c-Si material and a contact comprising p+ doped Si.

FIG. 13B shows the band diagram having an emitter junction between an n-type c-Si material and a contact comprised of a p+ a-Si:H/i a-Si:H stack (structure shown, for example, in FIG. 5) according to one embodiment of the present disclosure; wherein "a" stands for an amorphous semiconductor material, "i" stands for intrinsic semiconductor material, "c" stands for crystalline semiconductor, and "H" stands for hydrogenated. Since a-Si:H has a larger band gap that crystalline or multi/poly-crystalline Si, the gain of this device is improved with respect to the conventional homojunction device.

FIG. 13C shows the schematic band diagram and cross section of a device comprised of an n-type c-Si material and an emitter structure, i.e., contact, comprised of p+ a-Ge:H/p+ a-Si:H/i a-Si:H stack (structure shown, for example, in FIG. 12A) according to one embodiment of the present disclosure. The doping level in a-Ge:H is enhanced by transfer of holes from p+ a-Si:H into p+ a-Ge:H and/or transfer of electrons from p+ a-Ge:H into p+ a-Si:H. As a result, hole injection from emitter to base is improved due to the enhanced doping of p+ a-Ge:H, while the electron injection from base to emitter is suppressed due to the larger band gap of a-Si:H (with respect to the Si substrate). Therefore the gain of the transistor is improved. In addition, the contact resistance of the device at the emitter may also be improved since the higher doping level and/or smaller band gap of a-Ge:H may allow a better ohmic contact (for example to a metal electrode) to the emitter.

FIG. 13D shows the schematic band diagram and cross section of a device comprised of an n-type c-Si material and an emitter structure (i.e., contact) comprised of a p+ a-Si:H/p+ a-Ge:H/p+ a-Si:H/i a-Si:H stack (i.e., a 3-layer p+ a-Si:H/a-Ge:H supperlattice, and a single-layer i a-Si:H interlayer; see the structure shown in FIG. 12B) according to one embodiment of the present disclosure. In this embodiment, the doping of the p+ a-Ge:H layer may be further enhanced since transfer doping occurs from two p+ a-Si:H layers rather than one.

In some embodiments, a supperlattice structures with more than 3 layers may be used. The supperlattice structures may be formed by selecting relatively high and low band gap materials from a group of various materials such as a-Si:H, a-Ge:H, a-SiGe:H, a-SiC:H, a-SiO:H, a-SiN:H, nc-Si:H, nc-Ge:H, nc-SiGe:H, nc-SiC:H, nc-SiO:H, nc-SiN:H, μc-Si:H, μc-Ge:H, μc-SiGe:H, μc-SiC:H, μc-SiO:H, μc-SiN:H or combinations thereof, wherein "nc" stands for nanocrystalline and (μc) stands for microcrystalline semiconductor materials. The band gap of a-Si:H is typically in the range of 1.7-1.8 eV; however, as known in the art, larger or smaller band gaps are possible by varying the deposition conditions. The band gap of a-Ge:H is typically in the range of 0.9-1.2 eV; however, similar to a-Si:H, larger and smaller band gaps are also possible. An alloy of two semiconductor materials has a band gap depending linearly on the atomic fractions of the two semiconductors, e.g., an alloy of a-Si$_x$Ge$_{1-x}$ has a band gap of $xE_{g1}+(1-x)E_{g2}$, where $E_{g1}$ is the band gap of a-Si:H, $E_{g2}$ is the band gap of a-Ge:H, x the atomic fraction of Si (number of Si atoms in the lattice divided by the total number of Si and Ge atoms), and $_{1-x}$ the atomic fraction of Ge (note that 0≤x≤1). Similarly, the band gap of an a-Si$_x$C$_{1-x}$:H alloy is increased typically from 1.7-1.8 eV to 3.6-3.7 eV as the atomic fraction of C is increased from 0 to 1. Addition of N, O or both to a-Si:H, a-Ge:H or a-SiGe:H increases the band gap, but the increase in band gap is not typically a linear function of the atomic percentage. Hydrogenated amorphous silicon-nitride (a-Si$_x$N$_{1-x}$:H) typically has a band gap of 5-5.5 eV for the stoichiometric composition x=0.42, and the band gap can be varied by changing the atomic percentage of N. Hydrogenated amorphous silicon oxide (a-SiO:H) has band gaps comparable with a-SiN:H. The band gap of semiconductor alloys or oxides/nitrides may be varied by changing the crystalline portion of the materials.

The band gap of nanocrystalline (nc) or microcrystalline (μc) semiconductor materials is generally lower that that of amorphous materials having the same composition. The band gap of hydrogenated nano/microcrystalline Si varies between ~1.1 eV to ~1.8 eV as the material structure varies from fully single/poly-crystalline to fully amorphous. Similarly, the band gap of hydrogenated nano/microcrystalline Ge varies between ~0.6 eV to ~1.2 eV as the material structure varies from fully single/poly-crystalline to fully amorphous. Similarly, the band gaps of hydrogenated nano/micro-crystalline SiC, SiO, SiGeO, GeO and SiN compounds are lower than that of a-SiC:H, a-SiO:H, a-SiGeO:H, a-GeO:H and a-SiN:H, respectively. (This also applies to combinations thereof). In the PECVD process, the crystalline portion of the materials may be increased by increasing the hydrogen dilution of the source gases, increasing the plasma frequency (typically up to 120 MHz) or both. For example, hydrogenated nano-crystalline silicon oxide (nc-SiO:H) may be grown by PECVD with band gap in the range of 0.8-2.5 eV, depending on the growth conditions and oxygen content of the film.

In some embodiments and as mentioned above, the doped non-crystalline semiconductor material layer or both the doped non-crystalline semiconductor material layer and the interfacial intrinsic non-crystalline semiconductor material layer have a band gap lower than that of the crystalline semiconductor material. In such embodiments, the contact resistance at the junction may be improved due to the lower band gap of the doped non-crystalline semiconductor material layer (or due to the lower band gap of both the doped non-crystalline semiconductor material layer and the interfacial intrinsic non-crystalline semiconductor material layer). This is particularly useful in the case of wide gap semiconductor substrates, particularly with band gap larger than 2.0 eV. Examples of such wide gap semiconductors include but are not limited to gallium nitride (GaN), indium gallium nitride (InGaN), gallium phosphide (GaP), indium phosphide (InP), gallium phosphide nitride (GaPN), gallium antimony nitride (GaSbN), gallium arsenide phosphorous nitride (GaAsPN). In these embodiments, supperlattice structures may be used for the doped non-crystalline semiconductor material layers (as discussed earlier) to improve carrier injection at the emitter junction and/or lowering the contact resistance at the junction (emitter or other junctions).

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A heterojunction bipolar transistor comprising:
   a crystalline semiconductor material; and
   at least one contact in direct physical contact with a surface portion of the crystalline semiconductor material, wherein said at least one contact comprises an interfacial intrinsic non-crystalline semiconductor material in direct contact with the surface portion of the crystalline semiconductor material and a doped non-crystalline semiconductor material located on a surface of the interfacial intrinsic non-crystalline semiconductor material, wherein said interfacial intrinsic non-crystalline semiconductor material is hydrogenated, and said doped non-crystalline semiconductor material is non-hydrogenated.

2. The heterojunction bipolar transistor of claim 1, further comprising another doped non-crystalline semiconductor material located on a surface of said doped non-crystalline semiconductor material, wherein said another doped non-crystalline semiconductor material has a lower band gap than the doped non-crystalline semiconductor material.

3. The heterojunction bipolar transistor of claim 1, wherein said doped non-crystalline semiconductor material comprises a multilayered stack of alternating wide band gap semiconductor materials and narrow band gap semiconductor materials.

4. The heterojunction bipolar transistor of claim 1, further comprising an electrode material portion atop the doped non-crystalline semiconductor material.

5. The heterojunction bipolar transistor of claim 4, wherein said electrode material portion has outermost edges that are vertical coincide to outermost vertical edges of both said interfacial intrinsic non-crystalline semiconductor material and said doped non-crystalline semiconductor material.

6. The heterojunction bipolar transistor of claim 4, wherein said electrode material portion has outermost edges that are not vertical coincide to outermost vertical edges of both said interfacial intrinsic non-crystalline semiconductor material and said doped non-crystalline semiconductor material.

7. The heterojunction bipolar transistor of claim 1, further comprising passivation material layer portions located on other surface portions of the crystalline semiconductor material in which said at least one contact is not in direct physical contact with the surface portion of the crystalline semiconductor material of the first conductivity type.

8. The heterojunction bipolar transistor of claim 1, wherein said at least one contact is selected from a collector contact, an emitter contact, a base contact, and any combination thereof.

9. The heterojunction bipolar transistor of claim 8, wherein said collector contact and said emitter contact are located on a first side of the crystalline semiconductor material and said base contact is located on a second side of the crystalline semiconductor material which is opposite said first side.

10. The heterojunction bipolar transistor of claim 9, wherein said doped non-crystalline semiconductor material of said collector contact and said emitter contact is of a conductivity type that is opposite to a conductivity type of said crystalline semiconductor material.

11. The heterojunction bipolar transistor of claim 10, wherein said doped non-crystalline semiconductor material of said base contact is of a conductivity type that is the same as a conductivity type of said crystalline semiconductor material, and wherein the dopant concentration of said doped non-crystalline semiconductor material of said base contact is greater than the dopant concentration of the crystalline semiconductor material.

12. The heterojunction bipolar transistor of claim 8, wherein said collector contact, said emitter contact, and said base contact are each located on a first side of the crystalline semiconductor material.

13. The heterojunction bipolar transistor of claim 12, wherein said doped non-crystalline semiconductor material of said collector contact and said emitter contact is of a conductivity type that is opposite to a conductivity type of said crystalline semiconductor material.

14. The heterojunction bipolar transistor of claim 13, wherein said doped non-crystalline semiconductor material of said base contact is of a conductivity type that is the same as a conductivity type of said crystalline semiconductor material, and wherein the dopant concentration of said doped non-crystalline semiconductor material of said base contact is greater than the dopant concentration of the crystalline semiconductor material.

15. The heterojunction transistor of claim 1, wherein said crystalline semiconductor material is an uppermost layer of a semiconductor-on-insulator substrate.

* * * * *